United States Patent
Escher et al.

(10) Patent No.: US 10,964,462 B2
(45) Date of Patent: Mar. 30, 2021

(54) PRODUCTION METHOD FOR A RESISTOR, RESISTOR AND CORRESPONDING PRODUCTION INSTALLATION

(71) Applicant: ISABELLENHÜTTE HEUSLER GMBH & CO. KG, Dillenburg (DE)

(72) Inventors: Marcus Escher, Haiger (DE); Paul Harke, Dillenburg (DE); Ullrich Hetzler, Dillenburg-Oberscheld (DE); Jan Marien, Herborn (DE)

(73) Assignee: ISABELLENHÜTTE HEUSLER GMBH & CO. KG, Dillenburg (DE)

( * ) Notice: Subject to any disclaimer, the term of this patent is extended or adjusted under 35 U.S.C. 154(b) by 5 days.

(21) Appl. No.: 16/072,491

(22) PCT Filed: Jan. 25, 2017

(86) PCT No.: PCT/EP2017/000085
§ 371 (c)(1),
(2) Date: Jul. 24, 2018

(87) PCT Pub. No.: WO2017/129361
PCT Pub. Date: Aug. 3, 2017

(65) Prior Publication Data
US 2019/0066890 A1 Feb. 28, 2019

(30) Foreign Application Priority Data
Jan. 25, 2016 (DE) .......................... 102016000751.6

(51) Int. Cl.
*H01C 17/28* (2006.01)
*G01R 1/20* (2006.01)
(Continued)

(52) U.S. Cl.
CPC ............. *H01C 17/28* (2013.01); *G01R 1/203* (2013.01); *G01R 3/00* (2013.01); *H01C 1/144* (2013.01); *H01C 17/006* (2013.01); *H01C 17/22* (2013.01)

(58) Field of Classification Search
CPC ........... H01C 17/28; G01R 1/203; G01R 3/00
(Continued)

(56) References Cited

U.S. PATENT DOCUMENTS

| 4,906,968 A | 3/1990 | Gershenfeld et al. |
| 2009/0272169 A1* | 11/2009 | Pan .................... H01C 17/02 72/187 |

(Continued)

FOREIGN PATENT DOCUMENTS

| CN | 103165254 A | 6/2013 |
| DE | 4029107 A1 | 3/1992 |

(Continued)

OTHER PUBLICATIONS

European Search Report for EP93119644.8, dated Apr. 19, 1994, 1 page.

*Primary Examiner* — Renee S Luebke
*Assistant Examiner* — Iman Malakooti
(74) *Attorney, Agent, or Firm* — Klintworth & Rozenblat IP LLP

(57) ABSTRACT

The invention concerns a manufacturing method for an electrical resistor (1), in particular for a low-resistance current measuring resistor, with the following steps (S1-S4): a) providing a plate-shaped base part (9) for the resistor (1), the base part (9) having a certain thickness and corresponding to the thickness a certain value of an electrical component characteristic (R), the thickness-dependent electrical component characteristic (R) preferably being the electrical resistance (1) of the base part (9), the sheet resistance or the transverse resistance, and (Continued)

Figure 1:
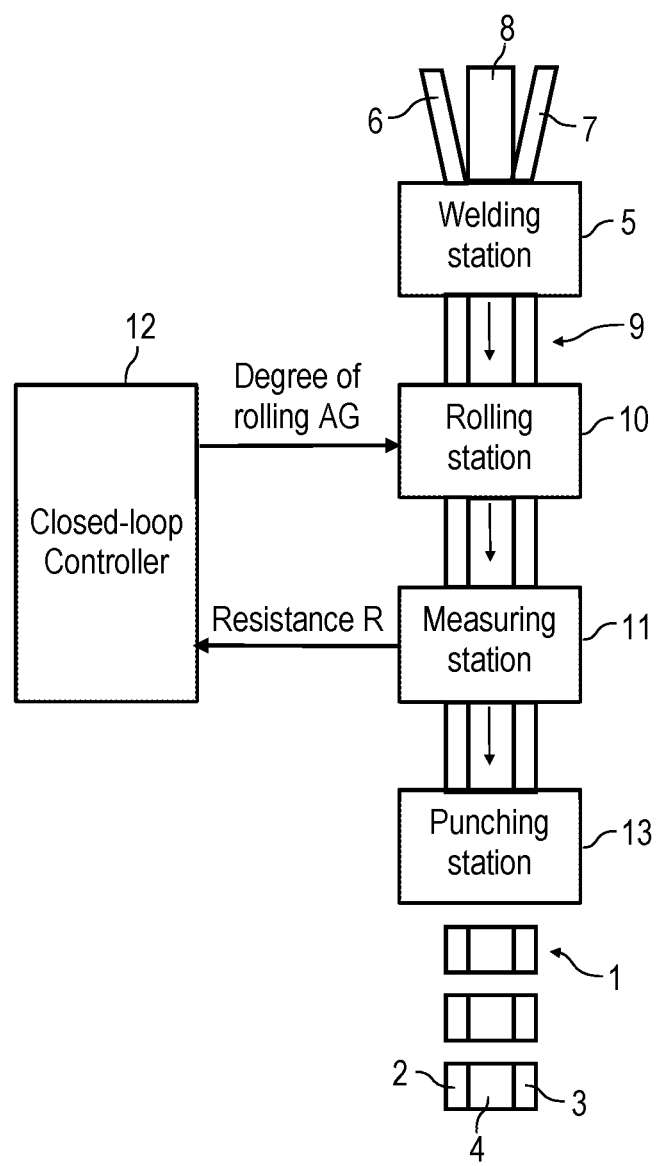

b) rolling the base part (9) with a certain degree of rolling (AG), the thickness of the base part (9) decreasing in accordance with the degree of rolling (AG) and the value of the component characteristic (R) changing accordingly, c) measuring the thickness-dependent electrical component characteristic (R) on the rolled base part (9), and d) adaptation of the degree of rolling (AG) as a function of the measured electrical component characteristic (R), in particular in the context of a closed-loop control system with the electrical component characteristic (R) as controlled variable and the degree of rolling (AG) as control variable.

Furthermore, the invention includes an appropriately manufactured resistor and a corresponding production plant.

15 Claims, 2 Drawing Sheets

(51) Int. Cl.
*G01R 3/00* (2006.01)
*H01C 1/144* (2006.01)
*H01C 17/00* (2006.01)
*H01C 17/22* (2006.01)

(58) Field of Classification Search
USPC .......................................... 338/329
See application file for complete search history.

(56) References Cited

U.S. PATENT DOCUMENTS

| | | |
|---|---|---|
| 2010/0176913 A1 | 7/2010 | Hirano et al. |
| 2010/0236054 A1 | 9/2010 | Hirano |
| 2014/0059838 A1 | 3/2014 | Hirano et al. |
| 2017/0243679 A1* | 8/2017 | Hetzler .................. G01R 1/203 |

FOREIGN PATENT DOCUMENTS

| | | |
|---|---|---|
| DE | 4243349 A1 | 6/1994 |
| EP | 0437239 A3 | 7/1991 |
| EP | 0605800 B1 | 7/1994 |
| GB | 1 525 398 | 9/1978 |
| JP | 51-76552 A | 7/1976 |
| JP | 06224014 A | 8/2006 |

* cited by examiner

PRODUCTION METHOD FOR A RESISTOR, RESISTOR AND CORRESPONDING PRODUCTION INSTALLATION

The invention concerns a manufacturing method for an electrical resistor, in particular for a low-resistance current measuring resistor. Furthermore, the invention includes a resistor that is manufactured accordingly. Finally, the invention also includes a manufacturing plant for carrying out the manufacturing method in accordance with the invention.

Low-resistance current measuring resistors are known from EP 0 605 800 A1, which can be used for current measurement according to the well-known four-wire technology. The electrical current to be measured is conducted through the low-resistance current measuring resistor, whereby the voltage drop across the current measuring resistor is measured. The measured voltage drop then corresponds to the electrical current to be measured according to the Ohm's law.

Furthermore, a manufacturing method for such a low-resistance current measuring resistor is known from EP 0 605 800 A1. Three material strips of a conductor material (e.g. copper) or of a resistor material (e.g. Manganin®) are welded together along their longitudinal edges to form a composite material strip, with the material strip of the resistor material located in the middle. Then the current measuring resistors are separated from the composite material strip, which can be done by punching, for example, whereby the composite material strip is separated transversely to the longitudinal direction of the strip. Before the individual current measuring resistors are separated from the composite material strip, the composite material strip can be rolled so that it becomes longer and wider due to the thickness reduction without losing mechanical and electrical quality. After the individual current measuring resistors have been separated from the composite material strip, the desired resistance value must then be adjusted, for example by making an adjustment incision in the resistor element.

A disadvantage of this well-known manufacturing method is the fact that an adjustment cut must be made in the resistor element to set the desired resistance value, since the individual current measuring resistors after separation have only insufficient accuracy with regard to the resistance value.

A manufacturing method for metal film resistors is known from US 2014/0059838 A1, in which the individual metal film resistors are separated from a material strip. The resistance value of the separated metal layer resistors can be measured here. Depending on the measured resistance value of the separated metal layer resistors, the cutting width can then be adjusted to set the desired resistance value of the separated metal layer resistors. The measurement is therefore carried out on the separated metal layer resistors and not on the material strip (base part). In addition, only the cutting width is to be adjusted here, not the degree of rolling. This well-known manufacturing method is therefore not yet optimal.

Furthermore, a manufacturing method for chip resistors is known from US 2010/0176913 A1. Here too, the individual chip resistors are separated from a material strip, whereby the resistance value of the separated chip resistors can be adjusted by adjusting the thickness of the material strip according to the desired resistance value. However, it is not intended to make any electrical measurements on the material strip in order to adjust the thickness of the material strip depending on the measured value. This well-known manufacturing method is therefore not yet optimal either.

The invention is therefore based on the task of creating a correspondingly improved manufacturing method, a resistor produced in this way and a corresponding manufacturing plant.

This object is solved by the technical teaching of independent patent claims.

The invention is based on the technical-physical knowledge that rolling the composite material strip leads to a change in the electrical resistance of the composite material strip transversely to the longitudinal direction of the strip due to the associated reduction in thickness, which is then also reflected in a corresponding change in the electrical resistance of the individual current measuring resistor. The invention therefore comprises the general technical teaching of closed-loop controlling or open-loop controlling the rolling process in a targeted manner in order to set the desired resistance value.

The manufacturing method according to the invention therefore provides first and foremost, in accordance with the state of the art, that a plate-shaped base part (e.g. a composite material strip) is provided for the resistor, the base part having a certain thickness and corresponding to the thickness a certain value of an electrical component characteristic (e.g. electrical resistance).

In a preferred embodiment of the invention, the plate-shaped base part for the resistor is a composite material strip, as is known from EP 0 605 800 A1, for example, so that the content of this earlier patent application is fully attributable to the present description with regard to the structure and manufacture of the composite material strip.

Alternatively, however, it is also possible that the plate-shaped base part is only a blank (blank) from which several resistors can be separated.

Another example of a suitable base part is a resistor film.

The thickness-dependent electrical component characteristic can be the electrical resistance of the base part, for example. In the case of a composite material wall as a base part, the thickness-dependent electrical component characteristic is then preferably the electrical resistance transverse to the longitudinal direction of the strip. Alternatively, however, it is also possible that the thickness-dependent electrical component characteristic is the sheet resistance of the base part.

Furthermore, in accordance with the state of the art, the manufacturing method according to the invention comprises a method step which provides for the rolling of the base part with a certain degree of rolling, whereby the thickness of the base part is reduced in accordance with the degree of rolling and the value of the component characteristic changes accordingly. The rolling of the base part thus leads to a reduction in the thickness of the base part and thus to a change in the cross-section of the base part, which usually results in a corresponding increase in the electrical resistance.

The term "degree of rolling" used in the invention describes the reduction of the component thickness during rolling and is usually given as a percentage. A degree of rolling of 50% means, for example, that the thickness of the base part during rolling is reduced to 50% of the initial thickness. In contrast, a rolling degree of 20% means that the thickness of the base part during rolling is reduced to 80% of the starting thickness.

The manufacturing method according to the invention is now distinguished from the state of the art in that the thickness-dependent electrical component characteristic (e.g. electrical resistance) is measured on the rolled base part, i.e. after rolling of the base part. For example, the electrical resistance of a composite material strip can be measured transversely to the longitudinal direction of the strip.

In addition, the inventive manufacturing method is distinguished from the state of the art in that the degree of rolling is adjusted as a function of the measured electrical component characteristic so that the finished resistors have the desired resistance value as exactly as possible, so that the insertion of a normally required adjustment cut can be dispensed with if possible.

If the resistance value measured on the rolled composite material strip is too low, this indicates that the degree of rolling is too low, i.e. the rolled composite material strip is too thick. In this case, the degree of rolling is slightly increased in order to reduce the thickness and thus increase the resistance of the rolled composite strip accordingly.

If, on the other hand, the resistance of the rolled composite material strip is measured too high, this indicates that the thickness of the rolled composite material strip is too low. In this case, the degree of rolling is reduced accordingly to obtain a thicker composite strip after rolling and a correspondingly lower resistance.

The measurement of the thickness-dependent electrical component characteristic on the rolled base part and the corresponding adjustment of the degree of rolling is preferably carried out continuously during the running manufacturing method, so that the actual value of the measured component characteristic is kept within a narrow tolerance range around a predetermined target value for the diameter dependent electrical component characteristic.

This adjustment of the degree of rolling is preferably carried out in the frame of a closed-loop control system (i.e. with a feedback loop) with the electrical component characteristic as the controlled variable and the degree of rolling as the manipulated variable.

In the preferred embodiment of the invention, the base part is rolled in a rolling station and the component characteristic of the rolled base part is then measured in a measuring station. In this case, the base part is preferably conveyed by a conveying device first through the rolling station and then through the measuring station.

It should be mentioned here that the base part (e.g. composite material strip) is preferably conveyed continuously through the rolling station and through the measuring station, i.e. not in stop-and-go operation. The thickness-dependent electrical component characteristic of the base part is then preferably measured without stopping the conveying movement of the base part in the measuring station, while the base part is conveyed through the measuring station.

In the case of a composite material strip as a base part, the electrical transverse resistance of the rolled composite material strip can be measured by means of contact sliders, for example, which electrically contact the composite material strip on the opposite sides, thus enabling resistance measurement. However, the invention is not limited to this simple example with regard to the measuring principle for measuring the electrical transverse resistance, but can also be realized with other measuring principles.

It has already been mentioned above that the base part is preferably a composite material, as is known from EP 0 605 800 A1, for example, such a composite material strip consisting of several material strips which are joined together along their longitudinal edges, in particular by a weld seam (e.g. electron beam welding seam). Rolling the composite strip not only results in a reduction in thickness, but also in relative elongation. This is advantageous because relatively short welds along the longitudinal direction of the strip can be used to produce a relatively long composite strip in the rolled state. It must be taken into account here that the production of the welding seams is considerably more expensive than the rolling of the composite material strip. It is therefore economical to produce the welds on a relatively thick and correspondingly short material strip in order to roll the composite material strip in length to achieve the desired length. The relative elongation of the composite material strip achieved during rolling is therefore preferably at least 20%, 50%, 100%, 200%, 300% or even at least 400%.

In addition to the composite material strip, it should also be mentioned that it may, for example, be a tri-band, i.e. a composite material strip consisting of three material strips joined together along their longitudinal edges, the outer material strips consisting of a conductor material (e.g. copper), while the middle material strip consists of a resistor material (e.g. Manganin®).

Alternatively, however, it is also possible that the composite material strip is a bi-band consisting of two material strips joined together along their longitudinal edges, one material strip consisting of a conductor material (e.g. copper), while the other material strip consists of a resistor material (e.g. Manganin®).

It has already been mentioned above that the base part does not necessarily have to be a composite material strip. For example, it is also possible that the base part is a resistor film made of a resistor material (e.g. Manganin®).

In the case of a composite material strip as the base part, the electrical resistance across the longitudinal direction of the strip is preferably measured as the thickness-dependent electrical component characteristic, as has already been briefly mentioned above.

In the manufacturing method according to the invention, too, the individual resistors are preferably separated from the base part in a separation station after the composite material strip has been rolled. This separation can take place, for example, by punching in a punching station, whereby the separated resistor can also be bent or subjected to other forming processes.

It should also be mentioned that the invention does not only claim protection for the manufacturing method described above. Rather, the invention also claims protection for an electrical resistor manufactured according to the manufacturing method according to the invention, which is also expressed and recognizable in the finished resistor.

For example, it is not usually necessary for the invented resistor to have an adjustment incision in order to set the desired resistance value. The desired resistance value can be set for the invented resistor by continuously adjusting the degree of rolling during the manufacturing method.

It should be mentioned here that the resistor according to the invention usually has punched edges on its side edges parallel to the direction of current flow, which originate from a punching out of a composite material strip.

The resistor according to the invention usually has two connecting parts made of one conductor material (e.g. copper) in order to introduce the electrical current into the resistor or to discharge it from the resistor. A resistor element made of a resistor material (e.g. Manganin®) is arranged in the direction of current flow between these two connecting parts so that the electric current to be measured flows through the resistor element. The resistor element is connected to the two connecting parts by welds (e.g. electron welds), whereby the welds are rolled.

It should be mentioned here that the conductor material of the connecting parts has a lower specific electrical resistance than the resistor material.

It should also be mentioned that the invention is not limited to Manganin® in terms of the resistor material. For example, the resistor material can be a different copper-manganese alloy or a chromium-nickel alloy, such as a nickel-chromium-aluminium alloy. Other examples of a resistor material are a copper-nickel alloy or a copper-chromium alloy.

However, it should be mentioned that the resistor material preferably has a resistivity with a high temperature constancy, so that the temperature coefficient of the electrical resistance is preferably lower than $5·10^{-4}$ $K^{-1}$, $2·10^{-4}$ $K^{-1}$, $1·10^{-4}$ $K^{-1}$ or even $5·10^{-5}$ $K^{-1}$.

The resistance value of the resistor according to the invention is preferably extremely low and can be smaller than 1 Ω, 500 mΩ, 250 mΩ, 125 mΩ, 50 mΩ, 25 mΩ, 10 mΩ, 5 mΩ, 2 mΩ or even smaller than 1 mΩ, for example.

In contrast, the conductor material has a specific electrical resistance, which is preferably smaller than $10^{-5}$ mΩ, $10^{-6}$ mΩ or $10^{-7}$ mΩ.

The resistor material, however, preferably has a specific electrical resistance of less than $2·10^{4}$ Ωm, $2·10^{-5}$ Ωm or $2·10^{-6}$ Ωm.

It should also be mentioned that the connecting parts and/or the resistor element can be either flat or bent.

Regarding the rolling process it should be mentioned that the resistor on its rolled surfaces preferably has a low surface roughness, which is characterized by a roughness Rz<10 m, Rz<5 m, Rz<3 m, Rz<2 m or Rz<1 m.

Finally, the invention also includes a corresponding manufacturing plant for the manufacture of an electrical resistor and in particular for carrying out the manufacturing method described above.

The manufacturing plant according to the invention initially comprises a material feed for feeding a plate-shaped base part (e.g. composite material web) for the resistor, the base part having a certain thickness and corresponding to the thickness a certain value of a thickness-dependent electrical component characteristic.

Furthermore, in accordance with the state of the art, the manufacturing plant according to the invention comprises a rolling station for rolling the plate-shaped base part with a certain degree of rolling, whereby the thickness of the base part is reduced according to the degree of rolling and the value of the thickness-dependent electrical component characteristic changes accordingly.

Compared to the state of the art, the manufacturing plant according to the invention is now characterized by an additional measurement station that measures the value of the electrical component characteristic on the rolled base part.

With a composite material strip as the base part in the measuring station, for example, the electrical resistance of the rolled composite material strip can be measured transversely to the longitudinal direction of the strip.

In addition, the manufacturing plant according to the invention also comprises an adaptation device for adapting the degree of rolling as a function of the measured electrical component characteristic, wherein the adaptation device may, for example, comprise a closed-loop controller which measures the electrical component characteristic as a measured variable and adjusts the degree of rolling as a control variable as a function of the measured target/actual deviation.

Furthermore, the manufacturing plant according to the invention preferably comprises a welding station for welding together several material strips along their longitudinal edges to form a composite material strip, which then serves as the base part for the manufacturing method according to the invention.

Furthermore, the manufacturing plant according to the invention preferably comprises a separation station for separating the individual resistors from the rolled base part. For example, the separating station can be a punching station that punches out individual resistors from the composite material strip.

Finally, the manufacturing plant according to the invention can also have a conveyor device to convey the base part (e.g. composite material strip) through the rolling station, the measuring station and/or through the separating station.

Figure 2:
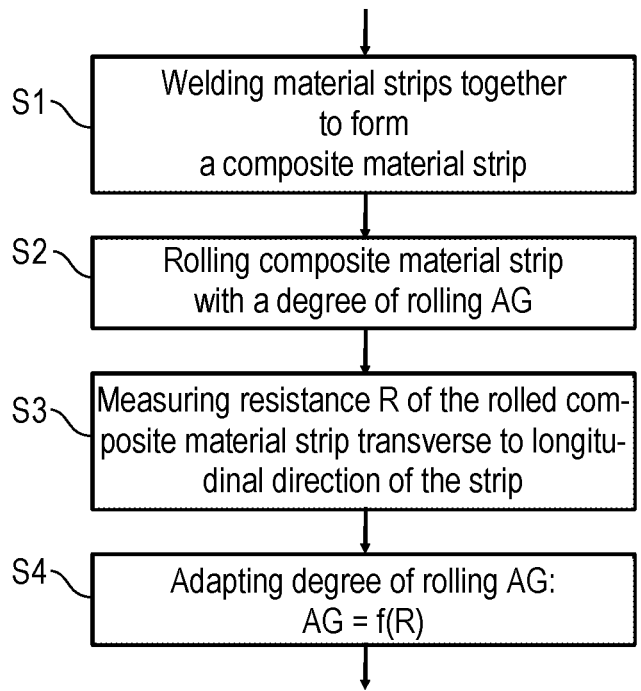
Figure 3:
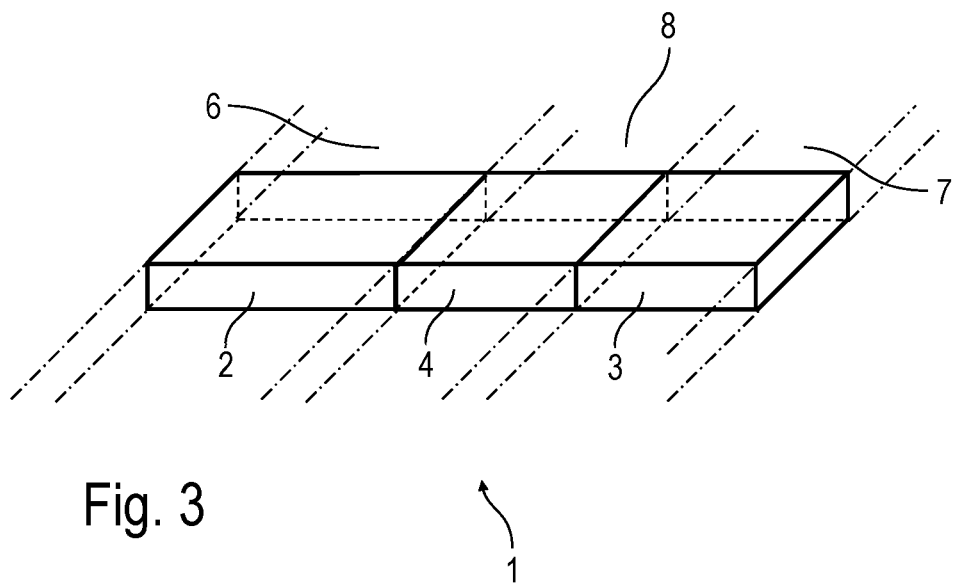

Other advantageous modifications the invention are characterised in the dependent claims or explained in more detail below together with the description of the preferred embodiment of the invention referring to the figures showing:

FIG. 1 a schematic representation of a manufacturing plant according to the invention for the manufacture of low-resistance current measuring resistors, FIG. 2 the manufacturing method according to the invention in the form of a flowchart, and FIG. 3 a perspective view of an current measuring resistor according to the invention.

FIG. 1 shows a schematic representation of an manufacturing plant according to the invention for the manufacture of low-resistance current measuring resistors 1, as they are already known in a similar form from EP 0 605 800 A1. The current measuring resistors 1 consist of two plate-shaped connecting parts 2, 3 made of copper or another conductor material and a resistor element 4 made of a resistor material, such as Manganin®. The resistor element 4 is arranged in the direction of current flow between the two connecting parts 2, 3, whereby the connecting parts 2, 3 serve to introduce an electrical current to be measured into the current measuring resistor 1 or to discharge it from the current measuring resistor.

To produce the current measuring resistor 1, two copper strips 6, 7 and a resistor strip 8 are fed to a welding station 5, which are then welded together in the welding station 5 along their longitudinal edges to form a composite material strip 9, which in itself is known for example from EP 0 605 800 A1.

The composite material strip 9 is then fed to a rolling station 10, whereby the rolling station 10 rolls the composite material strip 9 with an adjustable degree of rolling AG. Rolling the composite material strip 9 in the rolling station 10 leads to a corresponding thickness reduction of the composite material strip 9, which leads to a change in cross-section and thus also to a change in the resistance R across the longitudinal direction of the strip.

The rolled composite strip 9 is then fed to a measuring station 11, which measures the electrical resistance R of the composite strip 9 transversely to the longitudinal direction of the strip and passes it on to a closed-loop controller 12. The controller 12 then continuously controls the degree of rolling AG as a function of the measured resistance R in order to adjust the measured resistance R to a predetermined set value.

The composite material strip 9 is then finally fed to a punching station 13, in which the individual current measuring resistors 1 are separated from the composite material strip 9.

The controlled rolling down of the composite material strip 9 means that the resistance value of the individual current measuring resistors 1 corresponds extremely exactly to a specified set value, so that the otherwise necessary adjustment incisions can be dispensed with.

FIG. 2 shows the manufacturing method according to the invention in the form of a flow chart.

In a first step S1, the two copper strips 6, 7 are first welded together with the resistor strip 8 to form the composite material strip 9.

In a second step S2 the composite material strip 9 is then rolled with the specified degree of rolling AG.

In the next step S3, the resistance R of the rolled composite strip 9 is measured transversely to the longitudinal direction of the strip.

In a further step S4, the degree of rolling AG is then adjusted as a function of the measured resistance R.

The method steps S1-S4 are continuously repated within the framework of the manufacturing method according to the invention.

The invention is not limited to the preferred embodiment described above. Rather, a large number of variants and modifications are possible, which also make use of the idea of invention and therefore fall within the scope of protection. In particular, the invention also claims protection for the object and the characteristics of the dependent claims irrespective of the claims referred to in each case and in particular also without the characterising features of the main claim.

LIST OF REFERENCE SIGNS

1 Current measuring resistor
2 Connecting part
3 Connecting part
4 Resistor element
5 Welding station
6 Copper strip
7 Copper strip
8 Resistor strip
9 Composite material strip
10 Rolling station
11 Measuring station
12 Closed-loop Controllers
13 Punching station
AG Degree of rolling
R Resistance of the composite strip transversely to the longitudinal direction of the strip

The invention claimed is:

1. A method for manufacturing an electrical resistor:
providing a plate-shaped base part for the resistor, the base part having a certain thickness and corresponding to the thickness a certain value of a resistance;
rolling the base part with a certain degree of rolling, the thickness of the base part decreasing in accordance with the degree of rolling and the value of the resistance changing accordingly;
measuring the resistance on the rolled base part; and
adapting the degree of rolling as a function of the measured resistance.

2. A method for manufacturing according to claim 1, wherein the base part is rolled in a rolling station, the resistance of the rolled base part is measured in a measuring station, and the base part is first conveyed by a conveying device through the rolling station and then through the measuring station.

3. A method for manufacturing according to claim 2, wherein the base part is continuously conveyed through the rolling station and then through the measuring station, and the resistance of the base part is measured without stopping the conveying movement of the base part in the measuring station, while the base part is conveyed through the measuring station.

4. A method for manufacturing, according to claim 3, wherein the base part is a resistance foil which consists of a resistor material.

5. A method for manufacturing according to claim 1, wherein the base part is a composite material strip comprising at least two material strips joined together along their longitudinal edges, and the composite material strip is rolled in the longitudinal direction of the strip in order to extend the composite material strip through the rolling.

6. A method for manufacturing according to claim 5, wherein the composite material strip is a tri-band consisting of three material strips joined together along their longitudinal edges, the outer material strips consisting of a conductor material, while the middle material strip consists of a resistor material.

7. A method for manufacturing according to claim 5, wherein the composite material strip is conveyed in the longitudinal direction of the strip through the rolling station and then through the measuring station, and the electrical resistance is measured in the measuring station transversely to the longitudinal direction of the strip.

8. A method for manufacturing according to claim 5, wherein the composite material strip is stretched by rolling in the longitudinal direction of the strip with a relative elongation which is at least 20%.

9. A method for manufacturing according to claim 5, wherein the composite material strip is a bi-band consisting of two material strips joined together along their longitudinal edges, one material strip consisting of a conductor material while the other material strip consists of a resistor material.

10. A method for manufacturing according to claim 1, further comprising the following further step after rolling: separating the resistor from the base part in a separating station, by punching in a punching station.

11. A method of manufacturing according to claim 1, wherein the adapting of the degree of rolling is made in the context of a closed-loop control system with the resistance as a controlled variable and the degree of rolling as a control variable.

12. A manufacturing plant for producing an electrical resistor comprising:
a material feed for feeding a plate-shaped base part for the resistor, the base part having a certain thickness and corresponding to the thickness a certain value of a resistance;
a rolling station for rolling the plate-shaped base part with a certain degree of rolling, wherein the thickness of the base part is reduced in accordance with the degree of rolling;
a measuring station for measuring the resistance on a rolled output part; and
an adaptation device for adapting the degree of rolling as a function of the measured resistance.

13. A manufacturing plant according to claim 12, further comprising:
a welding station for welding together several material strips along their longitudinal edges to form a composite material strip which serves as the base part.

14. A manufacturing plant according to claim 13, further comprising a separating station for separating the individual resistors from the rolled base part, in the form of a punching station for punching out the individual resistor elements from the base part.

15. A manufacturing plant according to claim 14, further comprising conveying means for conveying the base part through the rolling station, the measuring station and/or the separating station.

* * * * *